United States Patent [19]
Ovshinsky et al.

[11] Patent Number: 6,141,241
[45] Date of Patent: *Oct. 31, 2000

[54] UNIVERSAL MEMORY ELEMENT WITH SYSTEMS EMPLOYING SAME AND APPARATUS AND METHOD FOR READING, WRITING AND PROGRAMMING SAME

[75] Inventors: Stanford R. Ovshinsky, Bloomfield Hills; Boil Pashmakov, Troy, both of Mich.

[73] Assignee: Energy Conversion Devices, Inc., Troy, Mich.

[*] Notice: This patent is subject to a terminal disclaimer.

[21] Appl. No.: 09/289,713

[22] Filed: Apr. 12, 1999

Related U.S. Application Data

[63] Continuation-in-part of application No. 09/102,887, Jun. 23, 1998, Pat. No. 5,912,839.

[51] Int. Cl.[7] .................................................. G11C 11/00
[52] U.S. Cl. ...................... 365/163; 365/185.03
[58] Field of Search ............... 365/185.03, 163, 365/185.12, 105; 257/3, 4

[56] References Cited

U.S. PATENT DOCUMENTS 5,166,901   11/1992   Shaw et al. ............................. 365/105
5,912,839   5/1999   Ovshinsky et al. ................ 365/185.03

*Primary Examiner*—David Nelms
*Assistant Examiner*—David Lam
*Attorney, Agent, or Firm*—Philip H. Schlazer; David W. Schumaker; Mavin S. Siskind

[57] ABSTRACT

A universal memory element having multi-level, non-detectable states and methods and apparatus for programming the same, and methods and applications embodying the same in neural networks, artificial intelligence and data storage systems. The universal memory element is programmed by applying one or more sub-interval energy pulses insufficient to switch the memory element from said high resistance state to said low resistance state, but sufficient to modify the memory material such that accumulation of additional energy pulses causes the memory element to switch from said high resistance state to said low resistance state.

21 Claims, 11 Drawing Sheets

UNIVERSAL MEMORY ELEMENT WITH SYSTEMS EMPLOYING SAME AND APPARATUS AND METHOD FOR READING, WRITING AND PROGRAMMING SAME

RELATED APPLICATION INFORMATION

The instant application is a continuation-in-part of U.S. application Ser. No. 09/102,887, filed Jun. 23, 1998 now U.S. Pat. No. 5,912,839.

FIELD OF THE INVENTION

The instant invention relates generally to programmable memory elements, and more specifically to erasable memory elements embodied in applications such as data storage, multi-value logic and neural network/artificial intelligence computing, and to methods and apparatus for reading, writing and programming same. The memory elements are programmable by the input of energy of any one or plurality of the following forms: e.g., electrical, optical, pressure, and/or thermal. In one embodiment, information can be stored in the memory elements of the invention in an encrypted form that is retrievable only by the use of specially programmed apparatus and methods. The invention is thus useful for the storage of information in an encrypted or secret format. In another embodiment, the invention is embodied in a neural network system.

BACKGROUND OF THE INVENTION

The general concept of utilizing electrically writeable and erasable phase change materials (i.e., materials which can be electrically switched between generally amorphous and generally crystalline states) for electronic memory applications is well known in the art, as is disclosed, for for example, in U.S. Pat. No. 3,271,591 to Ovshinsky, issued Sep. 6, 1966 and in U.S. Pat. No. 3,530,441 to Ovshinsky, issued Sep. 22, 1970, both of which are assigned to the same assignee as the present invention, and both disclosures of which are incorporated herein by reference (hereinafter the "Ovshinsky patents").

As disclosed in the Ovshinsky patents, such phase change materials can be changed between structural states of generally amorphous and generally crystalline local order or can be set between different detectable states of local order across the entire spectrum between completely amorphous and completely crystalline states. The early materials described by the Ovshinsky patents could be switched between two detectable structural states of generally amorphous and generally crystalline local order to accommodate the storage and retrieval of single bits of encoded binary information or they could be set at intermediate detectable levels of local order over the entire spectrum between completely amorphous and completely crystalline states.

That is, the Ovshinsky patents describe that the electrical switching of such materials is not required to take place between completely amorphous and completely crystalline states but rather that the detectable property, such as resistance, for example, can be set at any level over the whole range local order between the completely amorphous and the completely crystalline states. This property of varying local order provides a "gray scale" represented by the spectrum between the completely amorphous and the completely crystalline states. Such gray scale characteristic can be used as a substantially infinitely variable parameter such as, for example, a substantially infinitely variable resistance between maximum and minimum levels or it can be used to set incremental values of a selected parameter such as resistance, for example, in separately detectable steps between maximum and minimum levels.

The property of a variable parameter, such as resistance, adjustable over a gray scale range allows the application of these devices to neural network and artificial intelligence systems, for example, as described in the Ovshinsky patents. In another application of such devices as described in the Ovshinsky patents, the use of the element to set incremental and separately detectable levels of the parameter can accommodate the storage in a single memory element of multi-bit data.

SUMMARY OF THE INVENTION

The present invention relates to newly discovered and totally unexpected characteristics of such phase change materials and devices enabling the formation of universal memory elements utilizing such characteristics and to methods and apparatus for programming the same as well as to data storage, multi-value logic and neural network/artificial intelligence systems embodying such universal memory element devices.

In one embodiment, such universal memory elements are utilized in a form and format wherein information is stored by the application of one or more sequential electrical pulses of a selected magnitude and duration to the memory elements which are initially set in their high resistance state. The selected magnitude and duration of each pulse are such that the application of a single initial pulse is incapable of causing the memory element to switch from its high resistance state to its low resistance state. However, the selected magnitude and duration of each pulse are such that each pulse causes an incremental but at this stage undetectable structural change in the memory element These uniquely structured pulses are referred to herein as "sub-interval pulses" and, when applied in certain write and/or read sequence, they are referred to as "programming pulses". While the characteristics of these sub-interval pulses will be treated in more detail in the detailed description which follows, the following is a brief explanation for purposes of this summary of the invention.

What has been discovered pursuant to this invention and is truly remarkable about the instant Ovonic universal memory elements is that the set current pulse for setting the memory element from its high resistance state to its low resistance state can be divided into sub-interval pulses and, with application of each sub-interval pulse, the resistance of the memory device does not substantially change until the total integrated duration of the sub-interval pulses is equal to or greater than the "set duration" described above. Once the final sub-interval pulse has delivered the last increment of the energy, the device is transformed to the low resistance state.

Thus, the "set duration" of the set current pulse can be divided into a desired number of sub-intervals. The number of sub-intervals corresponds to the total number of multivalue-digital programming states of the element (In one embodiment, the total number of programming states is one greater than the number of sub-intervals). Once a specific number of sub-interval current pulses have been applied, the present state of the memory element is read by applying additional sub-interval programming pulses until the memory element is transformed from its high resistance state to its low resistance state. By reading the resistance of the element between each of the additionally applied sub-interval pulses, the number of additional pulses may be determined and compared to the number of total programming states. The difference is the present state of the memory element. The sub-interval pulses are also referred to herein as "programming pulses". In each case, the sub-interval pulses or programming pulses are insufficient to modify the phase change material but are sufficient, when cumulatively combined with additional subinterval or programming pulses, to cause the phase change material to switch from a high resistance state to a low resistance state.

The process of reading the present state of the memory element changes the present state and is thus a "destructive read". Hence, after the memory element is read it must be "reprogrammed." This is done by first resetting the device to the high resistance state with a high amplitude current pulse referred to herein as a "reset current pulse", and then applying the number of sub-interval current pulses needed to return the element to the "present state" prior to the read operation. The information which has been read out of the memory element is thus restored when the element is reprogrammed.

In one embodiment, the universal memory element of the present invention is embodied in a data storage system in which multiple bits are stored in each single memory element. This greatly increases the storage density of the memory since multiple bits can be stored in each universal memory element. In this embodiment, the data are also stored in non-detectable form and such the data cannot be read or retrieved except by employing the methods and apparatus of the present invention as will be set forth in the detailed description which follows. This embodiment thus enables the storage of information in secret form that is completely non-detectable by any means except the apparatus and methods of the present invention.

In another embodiment, the universal memory element of the present invention is embodied in a neural network and/or artificial intelligence system in which the memory element forms as well as controls the connectivity function between nodes or between the rows and columns of a neural processor. In this second embodiment, when the memory element connected between nodes or between the columns and rows of a neural processor receives a selected number of sub-interval pulses of selected assigned weights, the selected number and weighting of sub-interval pulses being determined, for example, by the programming and control strategy of a neural network, the memory element switches to the low resistance state to provide maximum connectivity between the selected nodes or between the rows and columns of a neural processor. This embodiment will also be described in further detail in the detailed description of the invention which follows below.

These and various other embodiments and applications of the present invention as well as other important features and principles of the present invention will be set forth C below in the detailed description of the invention.

DETAILED DESCRIPTION OF THE INVENTION

Figure 1:
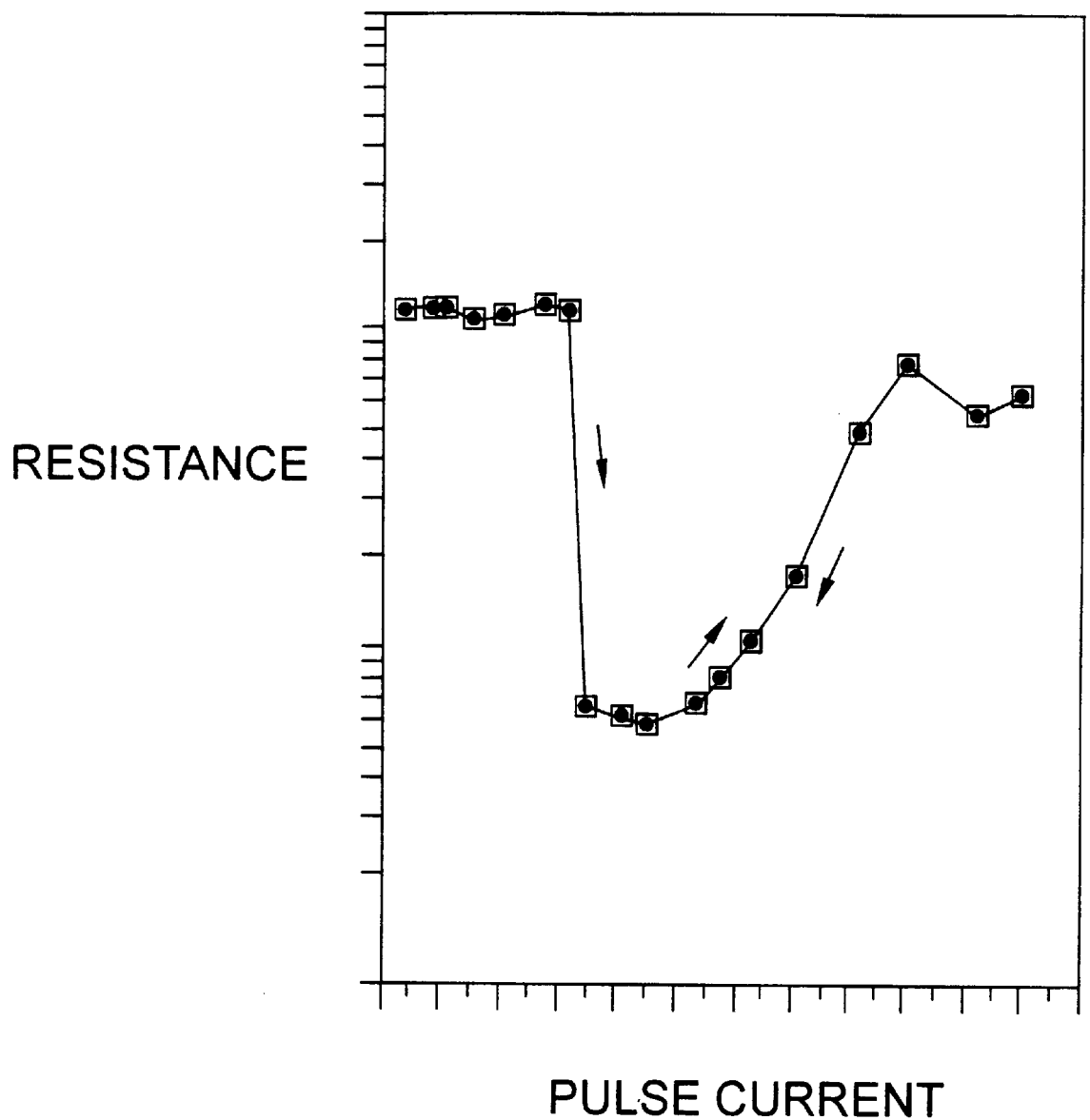
FIG. 1 is a graphical representation of a universal memory element of the present invention in which device resistance is plotted on the ordinate and the amplitude of the applied current pulse is plotted on the abscissa, said graph illustrating the different programming regimes of the universal memory element.

FIG. 1 is a plot of the amplitude of an applied current pulse versus device resistance for a universal memory element of the present invention. Referring to FIG. 1, the different programming regimes can be distinguished. In the left side of the curve, the resistance of the device remains substantially constant (i.e., in its high resistance state) until the device is reset by the application of a reset pulse of sufficient energy is applied. The device is then reset from its high resistance state to its low resistance state.

As the amplitude of the applied current pulse is further increased, the resistance of the device increases from the low resistance state to the high resistance state. This increase is both gradual and reversible as indicated by the arrows pointing in either direction up and down the right side of the curve. In this regime, the Ovonic memory element may be programmed to any resistance within a dynamic range of resistance values by applying a current pulse of appropriate amplitude. This type of programming scheme provides for analog, multistate, directly overwritable data storage and is the programming regime described in the Ovshinsky patents.

The method of programming of the present invention exploits the left side of the curve in FIG. 1. In this regime, both the amplitudes and durations of the current pulses used for programming the device are important. The transition on this side of the curve is not reversible, as indicated by the single arrow on the left side of the curve. That is, once the device has made the transition from the high resistance state to the low resistance state, the device cannot be reset to the high resistance state by applying a programming pulse of reduced current. Instead, the device may be reset to the high resistance state by a high-amplitude current pulse (i.e., a "reset pulse") that drives the resistance up the right side of the curve. As described above, and as will be further described hereinbelow, the digital multivalue capability of the device, when programmed in this regime, stems from the ability of the Ovonic memory device to "accumulate" or "integrate" the energy of each program current pulse applied to the device.

The universal memory element of the invention can store multiple bits of information in a single memory element, and, as further described below, can be used to provide different interconnectivities between the "neurons" or nodes of an artificially intelligent neural network.

Referring now to FIG. 1 for a further detailed explanation, assume that the device is in its high resistance state at the far left side of the characteristic curve of FIG. 1. As explained above, if a single reset pulse of sufficient energy is applied to the device, it will be reset ti its low resistance state. As further explained above, what has been discovered pursuant to this invention and is truly remarkable about the instant Ovonic universal memory elements is that the set current pulse for setting the memory element from its high resistance state to its low resistance state can be divided into sub-interval or programming pulses and, with application of each programming pulse, the resistance of the memory device does not substantially change until the total integrated duration of the programming pulses is equal to or greater than the "set duration" described above. Once the final programming pulse has delivered the last increment of the energy, the device is transformed to the low resistance state.

Thus, the set pulse can be divided into a number of equal interval sub-interval pulses, each representing a data storage bit. For example, if it is desired to store in a single memory element a full eight bit byte, the sub-interval pulse magnitude and height can divided, in one embodiment, such that eight pulses are required to cause the device to switch to its low resistance state. Then, the eight storage levels would be from 0 to 7 pulses to store decimal values from "0" to "7". If 0 pulses are initially applied to the element to store a "0", for example, then 8 pulses are required to switch the element to its low resistance state and this can be read as a "0" by subtracting from the number 8 the number of pulses required to switch. Thus, the stored value can be determined in each case by subtracting from the number 8 the number of pulses required to switch the memory element to its low resistance state. For example, if a "7" is stored, the number of pulses required to switch the element to its low resistance state is 1, and the stored decimal value is thus "7". Various logic protocols can be selected for the storage and retrieval of information in the universal memory elements of the invention.

Figure 2:
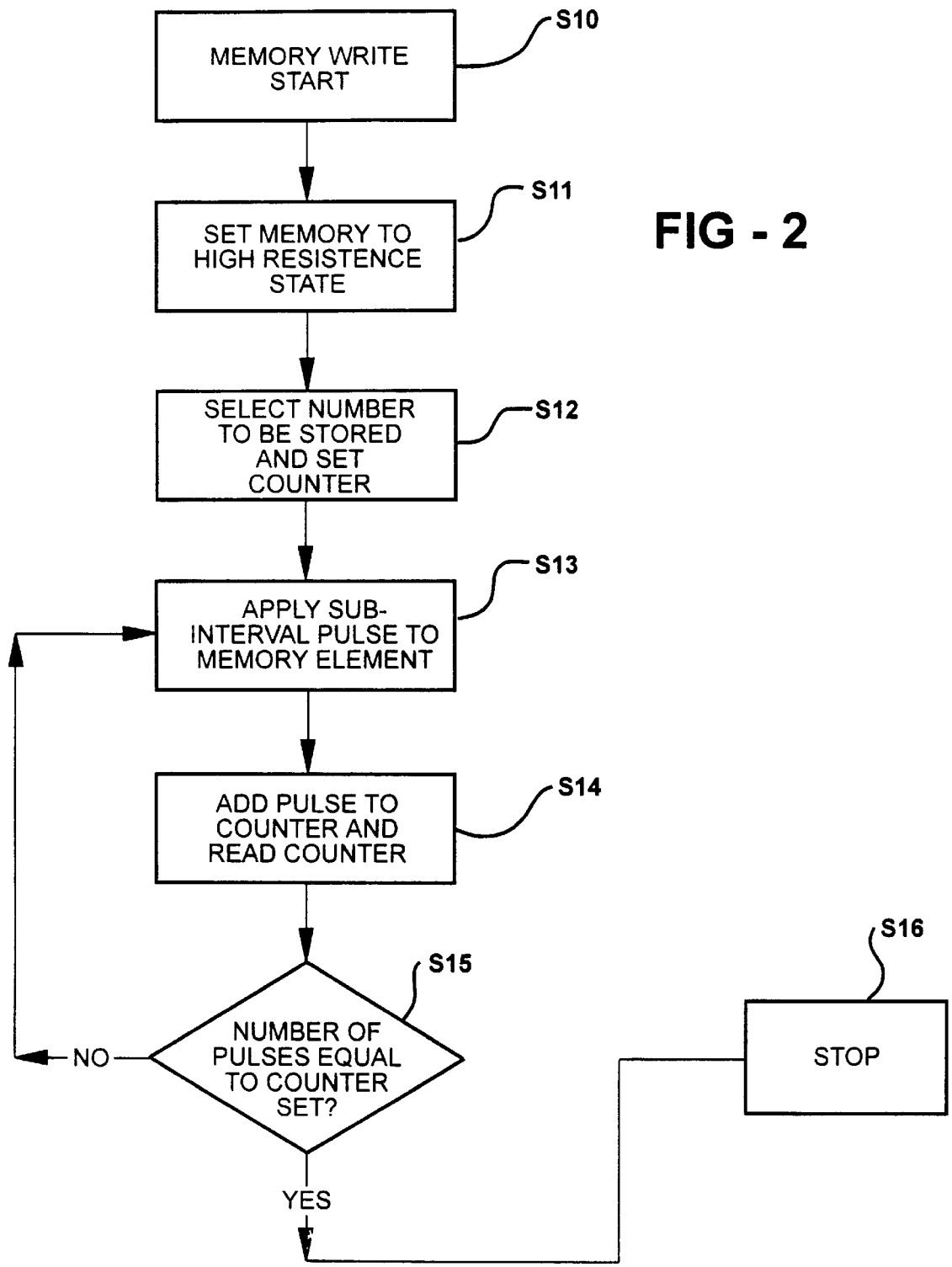
FIG. 2 is a flow chart illustrating an embodiment of a method according to the invention for writing data into a universal memory element of the invention.
Figure 3:
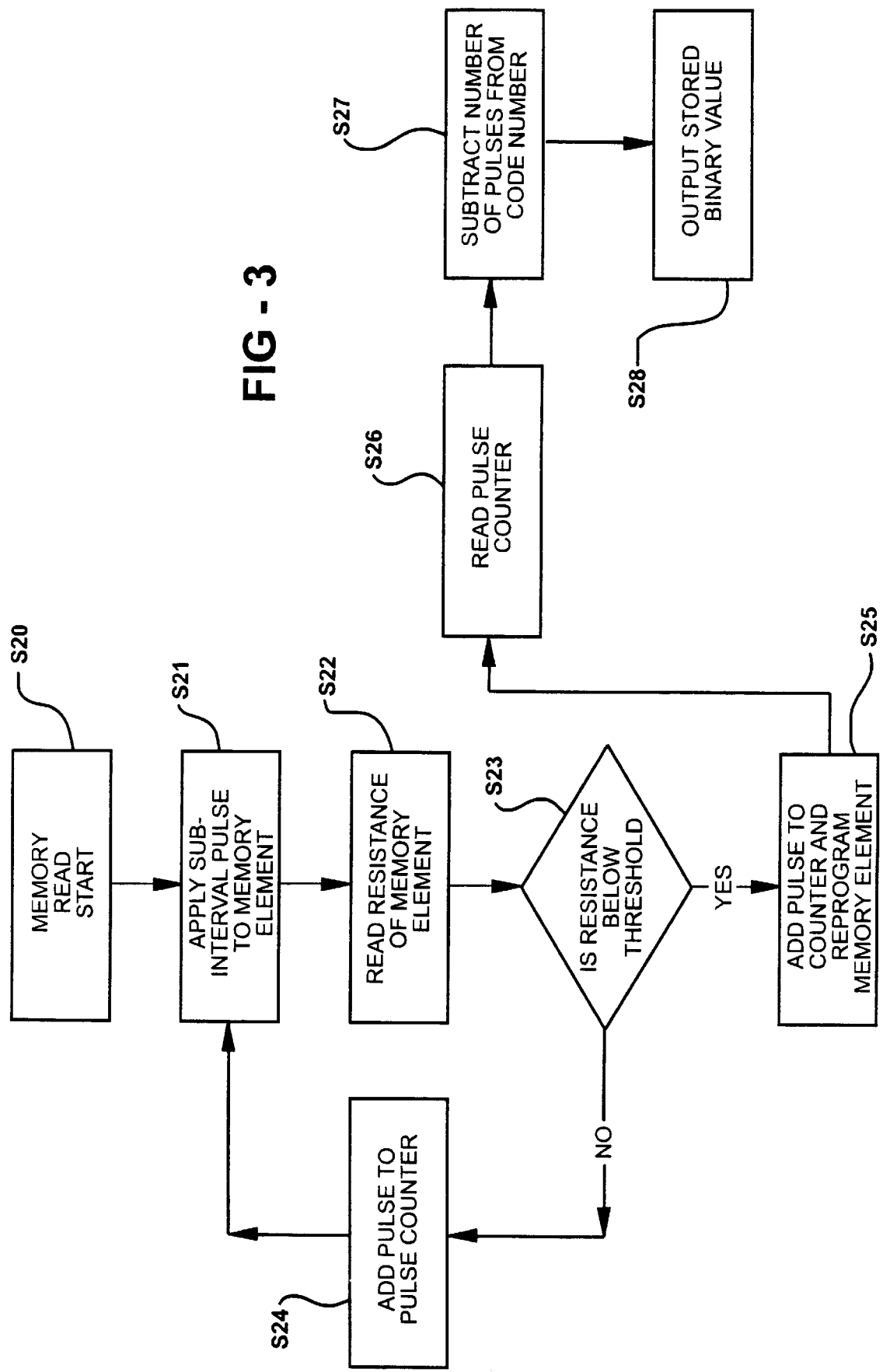
FIG. 3 is a flow chart illustrating an embodiment of a method according to the invention for reading data from a universal memory element of the invention.
Figure 4:
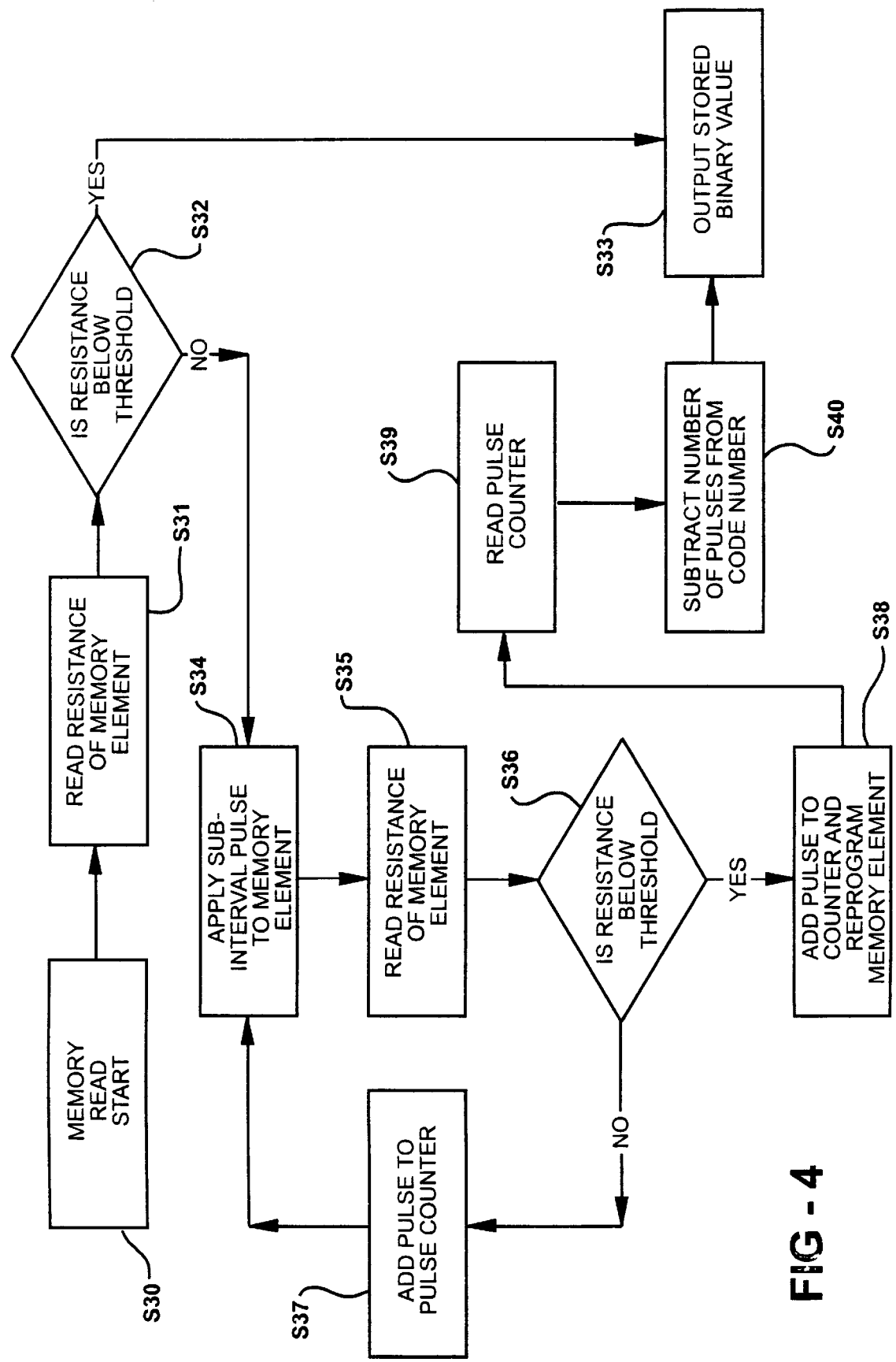
FIG. 4 is a flow chart illustrating another embodiment of a method according to the invention for reading data from a universal memory element of the invention.

For further explanation, reference is now made to the flow diagrams of FIGS. 2, 3 and 4. FIG. 2 is a flow chart showing a method of storing multi-bit information in accordance with one embodiment of the invention. In this method, a memory write start operation is initiated at step S10. At step S11, the memory element is first set in its high resistance state. This is to assure that the memory element is fully set in its high resistance state before commencing the write operation. A multi-bit value or number to be stored is selected at step S12 and a pulse counter is set to a given reference value corresponding to the number of pulses that are to be applied to the memory element. For the example given above, the number of pulses may represent a multi-bit binary number from "000" to "111" to accommodate storage of decimal values from "0" to "7". At step S13, a sub-interval pulse is applied to the memory element. At step S14, a pulse count is added to a pulse counter and the number of pulses which have been accumulated by the pulse counter is read.

At step S16, it is determined whether the number of pulses accumulated in the counter at that point is equal to the reference number of pulses stored in the counter. If the number of pulses read from the pulse counter is equal to the reference number stored in the counter, the operation is stopped at step S16. If the number of pulses read from the counter is less than the reference number stored in the counter, another sub-interval pulse is applied to the memory element by returning to step S13 and the operation is repeated until the number of sub-interval pulses is equal to the stored reference number, at which point the operation is stopped at step S16.

FIG. 3 is a flow chart for a particular logic protocol corresponding to that given in the example above described for an eight pulse system for storing a binary number from "000" to "111" in a single memory element. In this method, a memory read operation is initiated at step S20. At step S21, a sub-interval pulse is applied to the memory element and the resistance of the memory element is then read at step S22. Then, at step S23, it is determined whether the resistance of the memory element is below the threshold value corresponding to the low resistance state. If the memory element has not yet switched to the low resistance state, a pulse count is added to a pulse counter at step S24 and another sub-interval pulse is applied to the memory element by returning to step S21.

When the resistance of the memory element is determined to be below the threshold indicating that the memory element has switched to its low resistance state, the method moves to step S25 which adds a pulse count to the pulse counter and initiates the reprogramming of the memory element. The reprogramming of the memory element can be realized, for example, by applying the method shown in the flow chart of FIG. 2 as described above.

Then at step S26, the count from the pulse counter is read out and, at step S27, the number of pulses read from the counter is subtracted from the code number as described in the example given above to yield the stored binary value which is read out at step S28. For example, if seven pulses are required to switch the memory element to its low resistance state, the number seven is subtracted from the code number eight to yield a stored binary value "1". If five pulses are required to switch the memory element to its low resistance state, the number five is subtracted from the number eight to yield a decimal number three corresponding to the binary value "001".

In the embodiment of FIG. 3, the memory read operation is always begun by the application of a sub-interval pulse. In this embodiment, the maximum number of pulses to be applied is equal to the maximum number value to be stored in the memory element. However, in another embodiment, the maximum number of pulses to be applied is one pulse less than the maximum number value to be stored In this embodiment, the resistance of the memory element may already be set to the low resistance level when the memory read operation is commenced.

The read sequence for this embodiment is shown in the flow chart of FIG. 4. In this embodiment, the memory read operation is initiated at step S31 and, because the meory element may already be set in the low resistance state, the resistance of the memory element is read at a first step S31. If it is determined at step S32 that the resistance of the memory element is below the threshold value indicating that the memory element is already in its low resistance state, the stored binary value is then immediately read out at step S33. However, if it is determined at step S32 that the resistance of the memory element is above the threshold value indicating that the memory element is in its high resistance state, then a sub-interval pulse is applied to the memory element at step S34 and the resistance of the memory is read at step S35. If the resistance of the memory element is still above the threshold as determined in step S36, a pulse count is added to the pulse counter at step S37 and another sub-interval pulse is applied to the memory element at step S34.

When the resistance of the memory element is switched to the low resistance state as determined at step S38, a pulse count is added to the counter and the memory element is reprogrammed at step S38. Then, the pulse counter is read at step S39 and the number so read is subtracted from the code number at step S40 to yield the stored binary number at step S33. For this embodiment as applied to the eight bit byte storage example given above, the selected code number is 7. Thus, zero pulses subtracted from the code number seven yields a decimal number seven corresponding to a stored binary value "111" and seven pulses subtracted from the code number seven yields a decimal zero corresponding to a stored binary value "000".

In each case, the logic protocol for writing the value to be stored in accordance with the method of FIG. 2 would be selected to correspond to the read protocol of either of the embodiments of FIG. 3 or FIG. 4 as selected or to any other protocol that may be selected for storing information based on the number of sub-interval pulses to be applied and to be read out generally as described.

Figure 5:
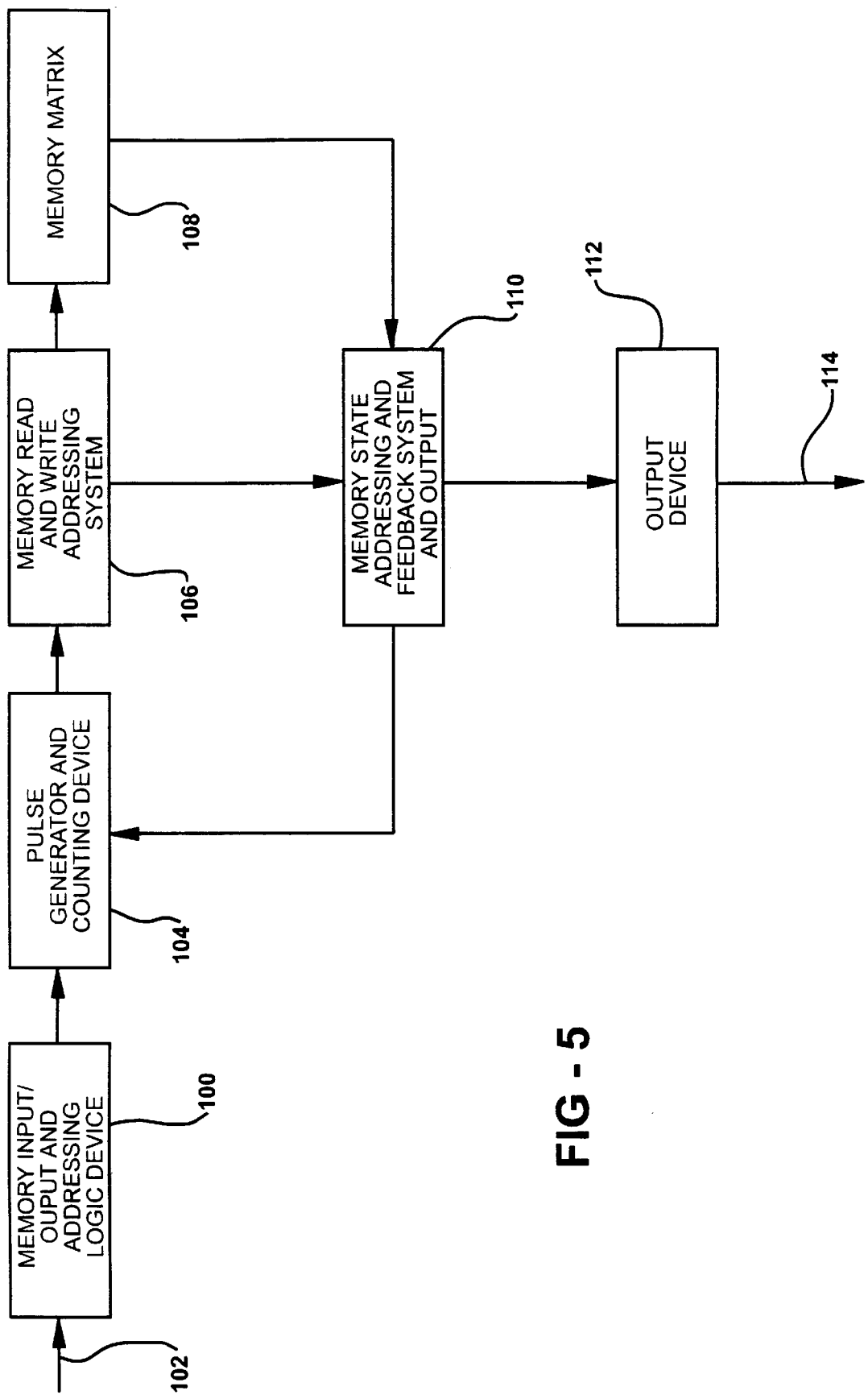
FIG. 5 is a block diagram of an embodiment of an apparatus according to the invention for writing data into and reading data from a universal memory element of the invention.

FIG. 5 shows an apparatus for practicing the memory write and read methods of the present invention. In the embodiment of FIG. 5, memory read and write operations are performed by apparatus comprising a memory input/output and addressing logic device 100 which is controlled by read and write commands applied at an input 102. This is connected to a pulse generator and counting device 104 which is in turn connected to a memory read and write addressing system 106 and to a memory matrix 108 comprising universal memory elements of the present invention. The state of each memory element is addressed and determined and fed back by a memory state addressing and feedback system 110 to the pulse generator and counting device 104.

Memory read and write commands introduced at the input 102 are carried out using the methods described above. For example, a read command at input 102 of memory input/output and addressing device 100 to read a selected multi-bit value from a selected memory location results in a response by the device 100 to set the pulse generator and counting device 104 to generate a reference count and to respond to feedback from the system 110 to determine when the reference count has been reached. The memory read and write and addressing system addresses the particular memory location to which the read command is to be applied.

The memory state addressing and feedback and output device 110 determines the state of the memory element at the addressed memory location and either feeds back a signal for the application of further sub-interval pulses from the device 104 or reads out the stored result to the output device 112. The write operation operates in the same way to carry out the methods described above.

As mentioned above, the multi-bit information stored in the universal memory element of the invention in accordance with the methods set forth herein is stored in non-detectable and therefore inaccessible form such that it cannot be retrieved except by employing the methods of the present invention using apparatus such as that shown in the embodiment of FIG. 5. This enables what is in effect encryption of the data stored in the universal memory elements.

In order to retrieve the stored data, both the magnitude and the duration of the unique sub-interval pulse must be known. Any attempt to determine this by experimentation will either result in no response at all if the pulse magnitude is below the threshold value or in a complete erasure of the stored data if the pulse is of too large in magnitude. Even if the pulse magnitude and duration were known, the code number and protocol selected for the storage of the data would also have to be known in order to enable the proper read out of the stored data. For example, if the protocol of the stored data were that requiring a read out as shown in the embodiment of FIG. 3 and a read out were attempted using the protocol as shown in the embodiment of FIG. 4, an erroneous read out would occur. Similarly, if the code number were six instead of eight, for example, an erroneous read out would also occur. These further levels of security are in addition to those provided by the unique sub-interval pulse characteristics which must be met in the first instance in order to avoid either no recovery at all or complete destruction of the data without recovery.

Various other protocols can also be imposed to provide even further levels of security. For example, the apparatus of FIG. 5 can be configured such that the correct reprogramming of each memory element to correctly replace each stored multi-bit value is required before read out of the stored information at the output device 112 is enabled. In this embodiment, if the data are erroneously read out of the memory matrix 108 and then erroneously reprogrammed as read out, the output device 112 will not deliver the stored information and the original data will have been destroyed.

The embodiments which have been discussed thus far utilize sub-interval pulses which are equal in magnitude and duration to each other. In other embodiments of the invention, the pulses differ from each other in various ways. A more complete discussion of the parameters which affect the unique characteristics of the sub-interval pulses and programming energy pulses in general will now be presented.

The universal memory element of the present invention comprises a volume of phase-change memory material having at least a high resistance state and a detectably distinct low resistance state. The high resistance state is characterized by a high electrical resistance, and the low resistance state is characterized by a low electrical resistance which is detectably distinct from the high electrical resistance state.

At least a volume portion of the volume of memory material is capable of being transformed from the high resistance state to the low resistance state in response to the input of a single energy pulse which is referred to herein as a "set energy pulse". The set energy pulse has an amplitude and a duration which is sufficient to transform the volume portion of memory material from the high resistance state to the low resistance state. The amplitude of the set energy pulse is defined herein as the "set amplitude" and the duration of the set energy pulse is defined herein as the "set duration". The act of transforming the volume of memory material from the high resistance state to the low resistance state is referred to herein as "setting" (or "to set", etc.) the volume of memory material from the high resistance state to the low resistance state.

Generally, as defined herein, the "energy" applied to the volume of memory material may be of any form including, but not limited to electrical energy, particle beam energy, optical energy, thermal energy, electromagnetic energy, acoustical energy, and pressure energy. The electrical energy may take the form of electrical current or voltage. Preferably, the electrical energy takes the form of electrical current and the set energy pulse is a set current pulse having an amplitude equal to a "set amplitude" and a duration equal to a "set duration" which are necessary and sufficient to set the volume of memory material from the high resistance state to the low resistance state.

Though not wishing to be bound by theory, it is believed that the energy applied to the memory material by the set energy pulse changes the local order of at least a portion of the volume of memory material. Specifically, the applied energy causes at least a portion of the volume of memory material to change from a less-ordered "amorphous" condition to a more-ordered "crystalline" condition. It is noted that the term "amorphous", as used herein, refers to a condition which is relatively structurally less ordered or more disordered than single crystal and has a detectable characteristic, such as high electrical resistivity. The term "crystalline", as used herein, refers to a condition which is relatively structurally more ordered than amorphous and has at least one detectably different characteristic, such as a lower electrical resistivity. Preferably, the low electrical resistivity of the crystalline state is detectably distinct from the high electrical resistivity of the amorphous state. The single set energy pulse is an energy pulse having an amplitude and duration which is sufficient to cause the memory material to crystallize to the extent necessary so that it is transformed from its high resistance state to its low resistance state.

It is noted that the actual amplitude and duration selected for the set amplitude and set duration depend upon certain factors including, but not limited to, the size of the volume of memory material, the memory material used, the type of energy used, and the means of applying said energy to the memory material, etc.

As described above, Ovonic memory elements may be set from the high resistance state to the low resistance state by a single energy pulse referred to herein as a "set energy pulse". The memory element of the invention may also be set from the high resistance state to the low resistance state by a plurality of energy pulses referred to herein as "program energy pulses" (to distinguish them from the set energy pulse). Unlike the set energy pulse, each of the plurality of program energy pulses is insufficient to cause the memory material to set from the high resistance state to the low resistance state. However, each of the program energy pulses is sufficient to modify at least a portion of the material so that the accumulation of the plurality of the program energy pulses is sufficient to cause the transformation from the high resistance state to the low resistance state.

Again not wishing to be bound by theory, it is believed that each of the plurality of program energy pulses applied to the volume of memory material "modifies" the material by causing some amount of crystallization (i.e., nucleation and/or crystal growth) in at least a portion thereof. The amount of crystallization caused by each of the program energy pulses alone is insufficient to cause the memory element to change from its high resistance to its low resistance states. However, the "accumulated" crystallization caused by the plurality of program energy pulses together is sufficient to set the memory element from its high resistance state to its low resistance state. Essentially, the volume portion of memory material "accumulates" the modifications (i.e., the crystallization) caused by each of the individual program energy pulses applied to the device.

Generally, the amplitudes and durations each of the plurality of sub-interval or program energy pulses may all be different. In one embodiment, the amplitudes are all the same and are preferably set equal to the amplitude of the set energy pulse (i.e., the "set amplitude"). The durations of each of the program energy pulses are selected by dividing the time interval of the set energy pulse, the "set duration", into a plurality of sub-intervals. (Hence, the integrated duration of all of the sub-intervals is equals to the "set duration".) The duration of each program energy pulse is set equal to a unique one of the subintervals.

Hence, a plurality of sub-interval or program energy pulses may be used to set the memory element from the high resistance state to the low resistance state where each of the program energy pulses has an amplitude equal to amplitude of the set energy pulse, and each of the program energy pulses has a duration equal to a unique one of the subintervals. As discussed above, the resistance of the memory element does not substantially change from the high resistance state until the last of the program energy pulses is applied to the volume of memory material. Once the final program energy pulse is applied, the device is transformed to the low resistance state.

It is again noted that the energy applied to the volume of memory material may be in the form of pulses of electrical current. Hence, the memory element may be set from the high resistance state to the low resistance state by a plurality of "program current pulses" where each program current pulse alone is insufficient to set the device. In one embodiment, the time duration defined by the duration of the "set current pulse" may be divided into sub-intervals. A plurality of program current pulses may be applied to the memory material where each program current pulse has an amplitude equal to the amplitude of the set current pulse and each program current pulse has a duration equal to a unique one of the sub-intervals. The device will be set after the last program current pulse is applied.

In one embodiment, data may be written into the memory element by applying one or more program energy pulses to the volume of memory material. Generally, the amplitudes and durations of the program energy pulses used may all be different. The amplitude of each program energy pulse may be chosen equal to the "set amplitude" of the set energy pulse described above. The duration of each program energy pulse is such that each pulse alone is insufficient to set the volume of memory material from the high resistance state to the low resistance state, and the integrated duration of all of the program energy pulses is less than or equal to the set duration of the set energy pulse.

As discussed, energy may be applied to the volume of memory material in the form of current pulses. Referring again to FIG. 1, as the amplitude of an applied current pulse increases to a sufficient amplitude, the device switches from a high resistance state to a low resistance state. A single current pulse sufficient to set the memory material from the high resistance state to the low resistance state is referred to herein as a "set current pulse" having an amplitude referred to as a "set amplitude" and a duration referred to as a "set duration".

Data may be written into the memory element by applying one or more "program current pulses" to the volume of memory material where each program current pulse is insufficient to set the device. Generally, the amplitudes and durations of the program current pulses may all be different. In one embodiment, the amplitude of each program current pulse is chosen equal to the set amplitude defined above. Further, the duration of each program current pulse is chosen (1) so that each pulse alone is insufficient to cause the material to be transformed from its high resistance state to its low resistance state, and (2) so that the integrated duration of all of the program current pulses is less than or equal to the "set duration" defined above.

In one implementation of the present programming method as described above, the time duration defined by "set duration" is divided into sub-intervals. The number of subintervals is chosen to be one less than the desired number of total possible programming states. As an example, if five total programming states are desired, the time interval "set duration" is divided into four sub-intervals (such that the integrated duration of all four subintervals is equal to "set duration"). Preferably, all of the sub-intervals are equal (however, other implementations are possible using sub-intervals that are not equal).

The element may be programmed to a desired "programmed state" by applying one or more program current pulses where each program current pulse has a duration equal to one of the sub-intervals and an amplitude equal to the "set amplitude" of the set current pulse. In the example using five total states, if no program current pulse is applied—the memory element remains in state, if one program current pulse is applied—the memory element is in state II, if two program current pulses are applied—the memory element is in state III, if three sub-interval pulses are applied—the memory element is in state IV, and if four sub-interval pulses are applied—the memory element is in state V.

It is noted that the resistance of the memory material does not substantially change until the total integrated duration of the sub-interval pulses is either equal to or greater than the "set duration". In the example above, the resistance will not substantially change until the forth sub-interval pulse is applied. After the forth pulse is applied, the resistance of the memory element will be transformed from the high resistance state to the low resistance state.

The programmed state of the memory element can be read by applying additional program current pulses until the memory material is set to its low resistance state and counting the number of additional pulses applied. In the example above, if one program current pulse was initially applied to write data into the memory element, the programmed state is state 11. In this case three additional program energy pulses would have to be applied in order to set the memory element to the low resistance state. The programmed state may be determined by subtracting the number of additional pulses needed (in this case 3) from the total number of possible states (in this case 5). Hence, the programmed state is 5−3=2 (i.e., state 11).

Hence, as described in connection with the embodiments presented above, the device may be read by first determining whether the volume portion of memory material is in the low resistance state. If it is not, then an additional program energy pulse is applied and the resistance of the device is again determined. If the memory element is still not in the low resistance state, then another additional program energy pulse is applied and the resistance of the device is again determined. This procedure is repeated until it is determined that the device is in the low resistance state. The number of additional program current pulses required to set the device are counted (i.e., a counter may be incremented for each additional program energy pulse required), and this number is used to determined the programmed state.

The method of programming may further include the step of erasing data from the memory element by applying a "reset energy pulse" to the volume of memory material. The reset energy pulse is an energy pulse sufficient to change the resistance of the volume of memory material from the low resistance state to the high resistance state. This is preferably an energy pulse sufficient to change at least a portion of the volume of memory material from a more-ordered crystalline state to a less-ordered amorphous state. It is noted that the program energy pulse (or program current pulse) described above is insufficient to change the resistance of the volume of memory material from the low resistance state to the high resistance state. As note above, the form of energy may be electrical current. Hence, the "reset current pulse" is a pulse of electrical current sufficient to change the resistance of the volume of memory element from the low resistance state to the high resistance state.

While much of the discussion above is in terms of current pulses, it is noted that any form of energy may be used to implement the programming method of the present invention. The types of energy include electrical energy, optical energy, electron beam energy, thermal energy, electromagnetic energy, acoustical energy, and pressure energy.

As discussed above, in one embodiment of the present invention, the method of programming described herein uses pulses of electrical current to program the memory element to apply the current pulses, the memory element of the present invention further comprises means for delivering electrical energy to at least a volume portion of the volume of memory material. In general, "current" is defined as the flow of electric charge. Examples of electric charge are electrons, protons, positive and negative ions, and any other type of charged particle. The flow of electric charge may be due to a beam of charged particles such as an electron beam or a proton beam.

In one embodiment of the present invention, the means for delivering is a first contact and a second contact. Each of the contacts is adjoining the volume of memory material. As used herein, a contact is "adjoining" the volume of memory material if at least a portion of the contact is actually touching the memory material.

Figure 6:
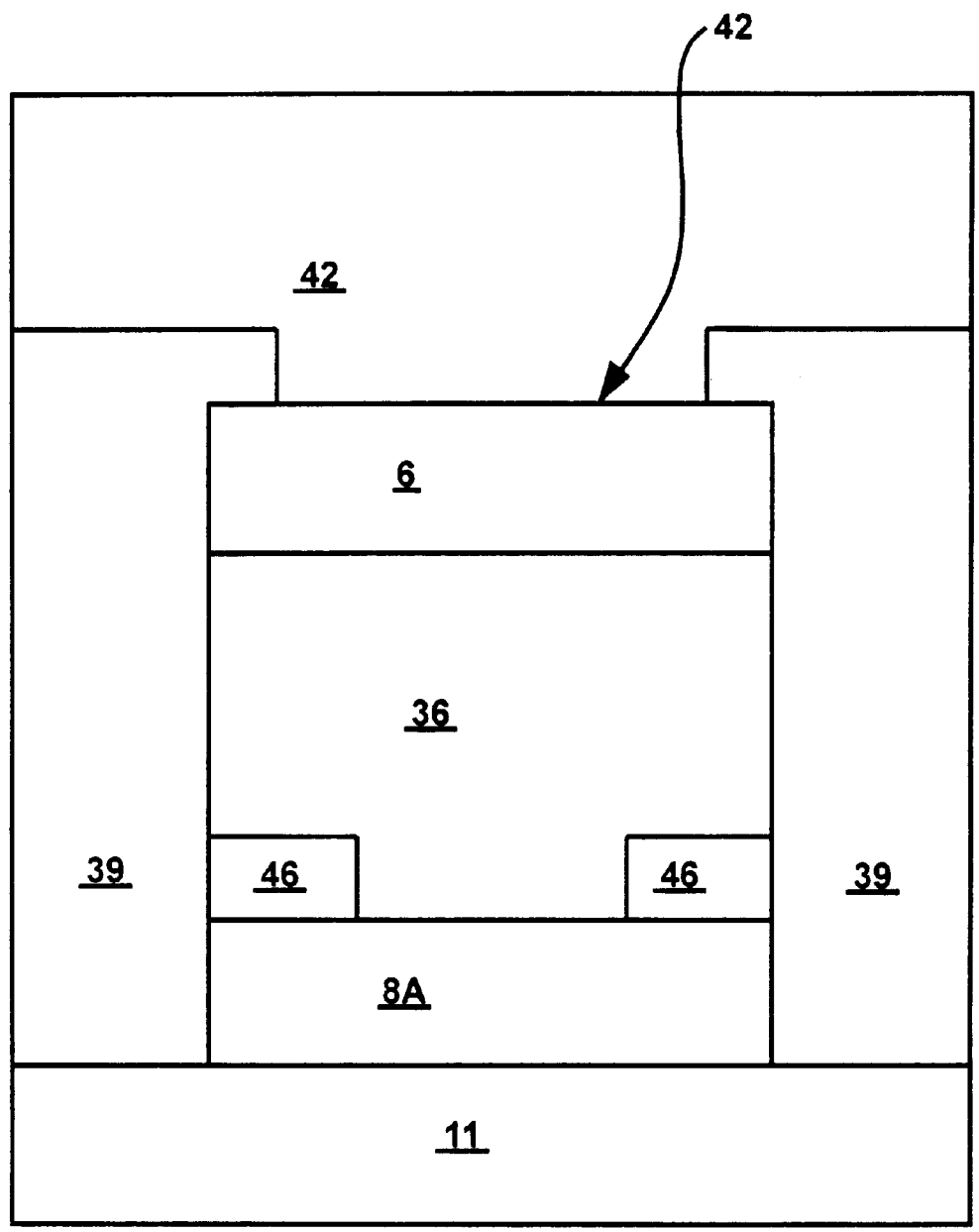
FIG. 6 is a cross-sectional view of a memory element of the present invention having a first and a second contact each adjoining the volume of memory material.

In another embodiment of the invention, the first and second contacts are a pair of spacedly disposed planar contacts adjoining the volume of memory material. Each of the contacts may be comprised of one or more thin-film contact layers. FIG. 6 shows a cross-sectional view of an embodiment of the memory element formed on a single crystal silicon semiconductor wafer 10. The memory element includes the memory material 36, a first spacedly disposed contact 6 adjoining the volume of memory material, and a second spacedly disposed contact 8A adjoining the volume of memory material. In the embodiment shown, the first and second contacts 6, 8A are planar contacts. At least one of the contacts 6, 8A may comprise one or more thin-film layers. An example of a memory element wherein the first and second contacts 6, 8A comprise two thin-film layers was disclosed in commonly assigned U.S. patent application Ser. No. 08/739,080, the disclosure of which is incorporated herein by reference.

The layer of memory material 36 is preferably deposited to a thickness of about 200 Å to 5,000 Å, more preferably of about 250 Å to 2,500 Å, and most preferably of about 250 Å to 500 Å in thickness.

The memory element shown in FIG. 6 may be formed in a multi-step process. Contact layer 8A, and insulation layer 46 are first deposited and the insulation layer 46 is then etched so that there will be an area of contact between the memory material 36 and contact layer 8A. Memory layer 36 and contact layer 6 are then deposited and the entire stack of layers 8A, 46, 36 and 6 are etched to the selected dimensions. Deposited on top of the entire structure is a layer of insulating material 39. Examples of insulating materials are $SiO_2$, $Si_3N_4$ and tellurium oxygen sulfide (e.g., TeOS). The layer of insulating material 39 is etched and a layer of aluminum 42 is deposited to form the second electrode grid structure 42 which extends perpendicular in direction to the conductors 12 and complete the X-Y grid connection to the individual memory elements. Overlaying the complete integrated structure is a top encapsulating layer of a suitable encapsulant such as $Si_3N_4$ or a plastic material such as polyamide, which seals the structure against moisture and other external elements which could cause deterioration and degradation of performance. The $Si_3N_4$ encapsulant can be deposited, for example, using a low temperature plasma deposition process. The polyamide material can be spin coated and baked after deposition in accordance with known techniques to form the encapsulant layer.

In still another embodiment of the invention, the means for delivering comprises at least one "tapered" contact. A tapered contact is a contact which tapers to a peak adjoining the volume of memory material. The embodiment of a memory element using a tapered contact is described in commonly assigned U.S. Pat. No. 5,687,112 to Ovshinsky et al, the disclosure of which is incorporated herein by reference.

The means for delivering may also be at least one field emitter. Field emitters are discussed in U.S. Pat. No. 5,557,596 to Gibson et al., the disclosure of which is incorporated herein by reference. The field emitter tapers to a peak which is positioned in close proximity to the volume of memory material. As defined herein, the terminology "in close proximity" means that the field emitter does not actually make contact with the volume of memory material. Preferably, the field emitter is placed between about 50 Å and about 100,000 Å from the volume of memory material. More preferably, the field emitter is placed between about 500 Å and about 50,000 Å from the volume of memory material.

The field emitter generates an electron beam from its tapered peak. As discussed in the '596 Patent, the electron beam may be extracted from the field emitter in many different ways. A circular gate may be positioned around the field emitter and an electric potential placed between the field emitter and the gate. Alternately, an electric potential may be placed between the field emitter and the actual volume of memory material. In still another embodiment, a contact (such as a planar contact) may be positioned adjoining the volume of memory material and spacedely disposed from the field emitter. An electric potential may be placed between the field emitter and the planar contact so that the electron beam is urged toward the volume of memory material and impinges the memory material. More than one field emitter may be used.

The field emitters may be made in a number of ways. One way is discussed in "Physical Properties of Thin-Film Field Emission Cathodes With Molybdenum Cones", by Spindt et al, published in the Journal of Applied Physics, Vol. 47, No. 12, December 1976. Another way is discussed "Fabrication and Characteristics of Si Field Emitter Arrays," by Betsui, published in Tech. Digest 4th Int. Vacuum Microelectronics Conf., Nagahama, Japan, page 26, 1991.

A partial vacuum may exist between the field emitter and the volume of memory material. As discussed in the '596 Patent, the partial vacuum may be at least $10^{-5}$ torr. Methods of fabricating field emitters in vacuum cavities are known in the art. Techniques are discussed in "Silicon Field Emission Transistors and Diodes," by Jones, published in IEEE Transactions on Components, Hybrids and Manufacturing Technology, 15, page 1051, 1992. Alternately, a gas may be interposed between the field emitter and the volume of memory material.

In yet another embodiment of the present invention, the means for delivering electric current is a tunneling contact which is placed in close proximity to the volume of memory material. The tunneling contact may be similar to a field emitter. It may taper to a peak that is positioned is close proximity to the volume of memory material. The tunneling contact does not actually touch the memory material, however, it is positioned within the quantum mechanical tunneling distance. Preferably, this distance is less than 50 Å.

Examples of phase-change materials were provided in U.S. Pat. No. 3,271,591 and U.S. Pat. No. 3,530,441, the disclosures of which are hereby incorporated by reference. Other examples of phase-change materials are found in commonly assigned U.S. Pat. No. 5,166,758, U.S. Pat. No. 5,296,716, U.S. Pat. No. 5,534,711, U.S. Pat. No. 5,536,947, and U.S. Pat. No. 5,596,522, and U.S. Pat. No. 5,687,112, the disclosures of which are also incorporated by reference herein.

The phase-change material is preferably "non-volatile". As used herein "non—volatile" means that the phase-change material will maintain the integrity of the information stored by the memory cell (within a selected margin of error) without the need for a periodic refresh.

The volume of memory material may comprise a mixture of a dielectric material and the phase-change material described above. The "mixture" may be either a heterogeneous mixture or a homogeneous mixture. Preferably, the mixture is a heterogeneous mixture. Memory material comprising a mixture of a phase-change material and a dielectric material is disclosed in commonly assigned U.S. Patent Application 09/063,174, the disclosure of which are incorporated herein by reference.

As used herein a "phase change material" is defined as a material which is capable of being reversibly switched between different detectable states having more local order (more crystalline states) and states having less local order (more disordered or more amorphous states) by the application of energy in electrical or other form. The phase change materials of this invention further exhibit the property of being able to accept inputs of energy which are below the level required to cause a detectable change in local order but which nevertheless cause changes in the structure of the material which are cumulative and which result in a detectable change in local order after a number of energy inputs are applied.

Preferably, the phase-change material of the invention includes one or more elements selected from the group consisting of Te, Se, Ge, Sb, Bi, Pb, Sn, As, S, Si, P, O and mixtures or alloys thereof. The phase-change material preferably includes at least one chalcogen element and may include at least one transition metal element. Preferably, the chalcogen element is selected from the group consisting of Te, Se and mixtures or alloys thereof. More preferably, the chalcogen element is a mixture of Te and Se.

The term "transition metal" as used herein includes elements 21 to 30, 39 to 48, 57 and 72 to 80. Preferably, the transition metal element is selected from the group consisting of Cr, Fe, Ni, Nb, Pd, Pt and mixtures or alloys thereof. Most preferably the transition metal is Ni. Specific examples of such multi-element systems are set forth hereinafter with respect to the Te:Ge:Sb system with or without Ni and/or Se.

It is further believed that the size of the crystallites which exist in the bulk of the semiconductor and memory material is relatively small, preferably less than about 2000 Å, more preferably between about 50 Å and 500 Å, and most preferably on the order of about 200 Å to about 400 Å.

Many of the phase-change materials of the present invention have a tendency toward the formation of more and smaller crystallites per unit volume. Crystallite sizes of the widest preferential range of representative materials embodying the present invention have been found to be far less than about 2000 Å, and generally less than the range of about 2,000 Å to 5,000 Å which was characteristic of prior art materials. Crystallite size is defined herein as the diameter of the crystallites, or of their "characteristic dimension" which is equivalent to the diameter where the crystallites are not spherically shaped.

It has been determined that compositions in the highly resistive state of the class of TeGeSb materials which meet the criteria of the present invention are generally characterized by substantially reduced concentrations of Te relative to that present in prior art electrically erasable memory materials. Examples of TeGeSb materials are provided in commonly assigned U.S. Pat. No. 5,534,711, U.S. Pat. No. 5,536,947, and U.S. Pat. No. 5,596,522. In one composition that provides substantially improved electrical switching performance characteristics, the average concentration of Te in the as deposited materials was well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. The percentages given are atomic percentages which total 100% of the atoms of the constituent elements. Thus, this composition may be characterized as $Te_a Ge_b Sb_{100-(a+b)}$. These ternary Te—Ge—Sb alloys are useful starting materials for the development of additional phase-change materials having even better electrical characteristics.

The phase-change materials of the present invention preferably include at least one chalcogen and may include one or more transition metals. The phase-change materials which include transition metals are elementally modified forms of the phase-change materials in the Te—Ge—Sb ternary system. That is, the elementally modified phase-change materials constitute modified forms of the Te—Ge—Sb phase-change alloys. This elemental modification is achieved by the incorporation of transition metals into the basic Te—Ge—Sb ternary system, with or without an additional chalcogen element, such as Se. Generally the elementally modified phase-change materials fall into two categories.

The first category is a phase-change material which includes Te, Ge, Sb and a transition metal, in the ratio $(Te_a Ge_b Sb_{100-(a+b)})_c TM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. The transition metal preferably include Cr, Fe, Ni, Nb, Pd, Pt and mixtures or alloys thereof.

The second category is a phase-change material which includes Te, Ge, Sb, Se and a transition metal, in the ratio $(Te_a Ge_b Sb_{100-(a+b)})_c TM_{100-(c+d)}$ where the subscripts are in atomic percentages which total 100% of the constituent elements, TM is one or more transition metals, a and b are as set forth above for the basic Te—Ge—Sb ternary system, c is between about 90% and 99.5% and d is between about 0.01% and 10%. The transition metal can preferably include Cr, Fe, Ni, Pd, Pt, Nb and mixtures or alloys thereof.

The phase-change material possesses substantially non-volatile set resistance values. However, if the resistance value of the phase-change material does drift from its original set value, "compositional modification", described hereinafter, may be used to compensate for this drift. As used herein, the term "non-volatile" refers to the condition in which the set resistance value remains substantially constant for archival time periods. Of course, software (including the feedback system discussed hereinafter) can be employed to insure that absolutely no "drift" occurs outside of a selected margin of error.

"Compositional modification" is defined herein to include any means of compositionally modifying the phase-change material to yield substantially stable values of resistance, including the addition of band gap widening elements to increase the inherent resistance of the material. One example of compositional modification is to include graded compositional inhomogeneities with respect to thickness. For instances, the volume of phase-change material may be graded from a first Te—Ge—Sb alloy to a second Te—Ge—Sb alloy of differing composition. The compositional grading may take any form which reduces set resistance value drift. For example, the compositional grading need not be limited to a first and second alloy of the same alloy system. Also, the grading can be accomplished with more than two alloys. The grading can be uniform and continuous or it can also be non-uniform or non-continuous. A specific example of compositional grading which results in reduced resistance value drift includes a uniform and continuous grading of $Ge_{14} Sb_{29} Te_{57}$ at one surface to $Ge_{22} Sb_{22} Te_{56}$ at the opposite surface.

Another manner of employing compositional modification to reduce resistance drift is by layering the volume of phase-change material. That is, the volume of phase-change material may be formed of a plurality of discrete, relatively thin layers of differing composition. For example, the volume of phase-change material may include one or more pairs of layers, each one of which is formed of a different Te—Ge—Sb alloy. Again, as was the case with graded compositions, any combination of layers which results in substantially reduced resistance value drift can be employed. The layers may be of similar thickness or they may be of differing thickness. Any number of layers may be used and multiple layers of the same alloy may be present in the volume of memory material, either contiguous or remote from one another. Also, layers of any number of differing alloy composition may be used. A specific example of compositional layering is a volume of memory material which includes alternating layer pairs of $Ge_{14}Sb_{29}Te_{57}$ and $Ge_{22}Sb_{22}Te_{56}$.

Yet another form of compositional inhomogeneity to reduce resistance drift is accomplished by combining compositional grading and compositional layering. More particularly, the aforementioned compositional grading may be combined with any of the above described compositional layering to form a stable volume of memory material. Exemplary volumes of phase-change material which employ this combination are: (1) a volume of phase-change material which includes a discrete layer of $Ge_{22}Sb_{22}Te_{56}$ followed by a graded composition of $Ge_{14}Sb_{29}Te_{57}$ and $Ge_{22}Sb_{22}Te_{56}$ and (2) a volume of phase-change material which includes a discrete layer of $Ge_{14}Sb_{29}Te_{57}$ and a graded composition of $Ge_{14}Sb_{29}Te_{57}$ and $Ge_{22}Sb_{22}Te_{56}$.

The memory material may be made by methods such as sputtering, evaporation or by chemical vapor deposition (CVD), which may be enhanced by plasma techniques such as RF glow discharge. The memory material is most preferably made by RF sputtering or evaporation. It may be formed by multiple source sputtering techniques making use of a plurality of targets, usually a target of the phase-change material and a target of the dielectric material. With these targets arranged in opposition to a substrate, sputtering is carried out while the substrate is rotated relative to each target. A target containing both phase-change and dielectric materials may be used as well. As well, substrate heating may be used to control the morphology of the phase-change material within the composite memory material formed by affecting crystal growth as well as crystal aggregation via surface mobility.

Another important application of the universal memory element of the instant invention is in a parallel processing network such as may be used, for example, in neural networks and in artificial intelligence computing systems. A parallel processing network comprises a vertically interconnected parallel distributed processing array which includes a plurality of stacked matrices of unit cells. Each unit cell is in data transmissive communication with at least one other unit cell in an adjoining plane. Preferably, the unit cells in a given plane are also interconnected to some degree. In this manner, a high degree of connectedness between individual unit cells of the array may be established. Parallel processing networks are discussed in commonly assigned U.S. Pat. No. 5,159,661, the contents of which are incorporated by reference herein.

Neural computation is based on mimicking the method of computing used by neurons in animals. A neuron accepts electric signals from a large number of other neurons. It assigns a weight or importance to each of these signals. The weights assigned are "learned" by the system through experience. When the sum of the weighted inputs exceed a threshold value, the neuron fires. This firing sends an electric signal to the inputs of a large number of other neurons.

The universal memory elements of the present invention can be incorporated into neural network systems to behave in much the same way. In such an embodiment, a number of weighted pulses are applied to the universal memory element until a threshold is reached and the element switches or "fires". A further advantage of the present invention is that the pulses do not have to be applied at the same time. The effect of each pulse is stored in nonvolatile form and remains stored until the next pulse is applied to add to the pulses already stored. The neural behavior can thus be attained using sequential pulses applied in any time pattern.

Figure 7:
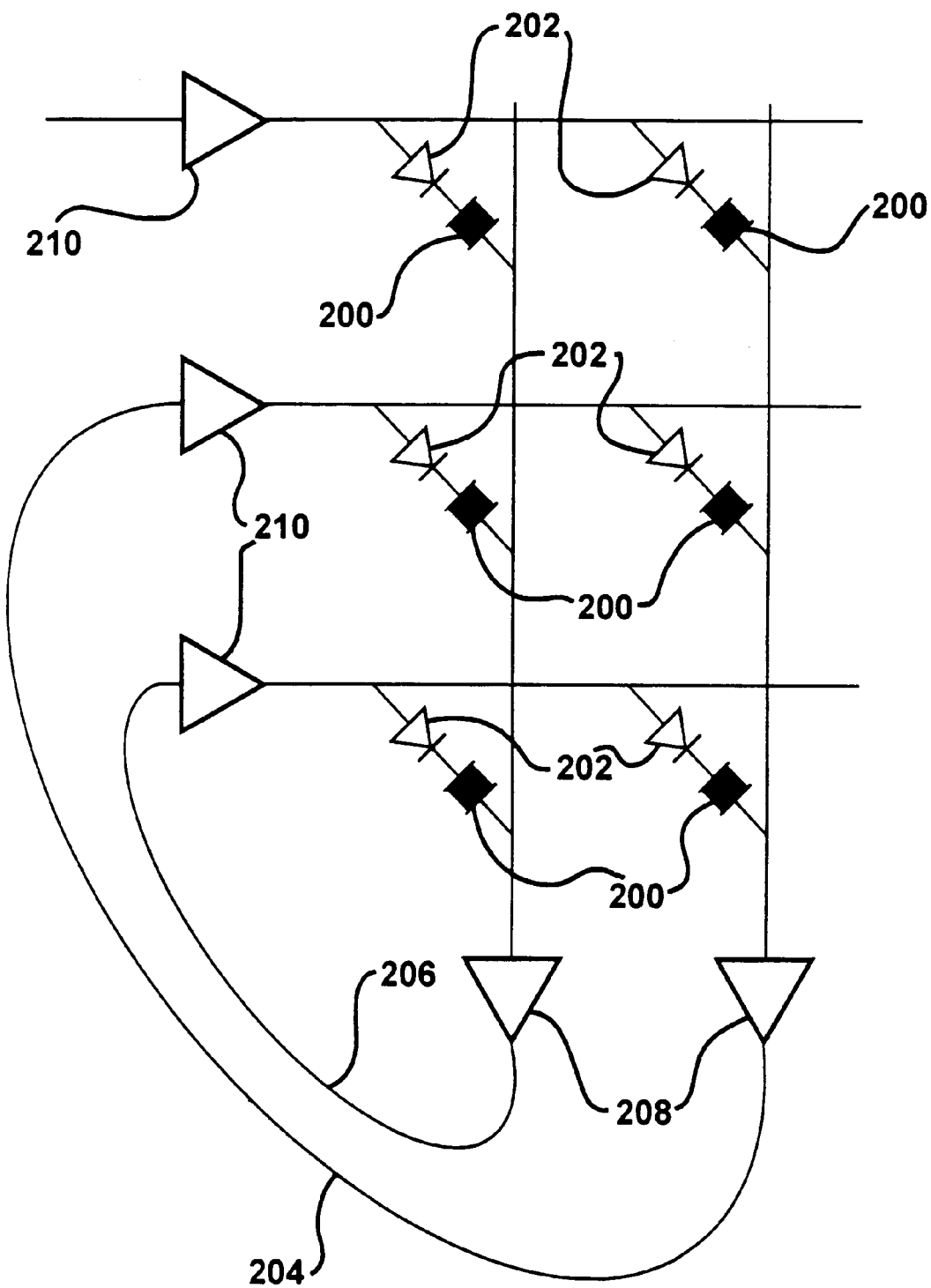
FIG. 7 is a schematic matrix diagram of a portion a neural processor embodying the invention and in which universal memory elements of the invention are incorporated.

This provides a simple, regular structure in the form of a memory array to perform neural logic functions. One embodiment of the present invention incorporated in a neural network processor is shown in FIG. 7. In this embodiment, an array of universal memory elements 200 of the present invention is formed with isolating diodes 202. Feedback paths 204 and 206 are established from the column outputs of the array to the row inputs of the array through sense amplifiers 208 and current drivers 210 as shown.

When an individual memory element 200 is in its high resistance state, the degree of connectivity between the row and column to which it is connected is low by reason of the high resistance.

Weighted pulses are applied by the current drivers to the universal memory elements 200 through isolating diodes 202 using a control strategy that decides when the pulses are applied and what weights are assigned to them. The effect of these pulses is cumulatively stored in each of the memory elements. When the selected threshold level is reached in any given memory element, it switches or "fires" to its low resistance state to increase the level of connectivity between the row and column to which its is connected by reason of the low resistance path that is established.

Figure 8:
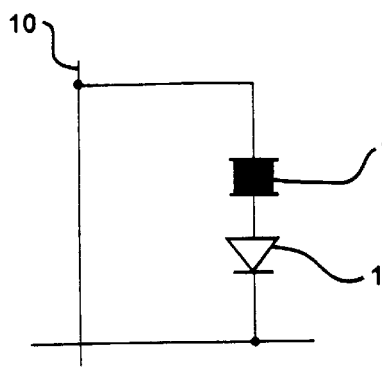
FIG. 8 is a schematic depiction of a unit cell of a neural network structure in accordance with the principals of the present invention.
Figure 9:
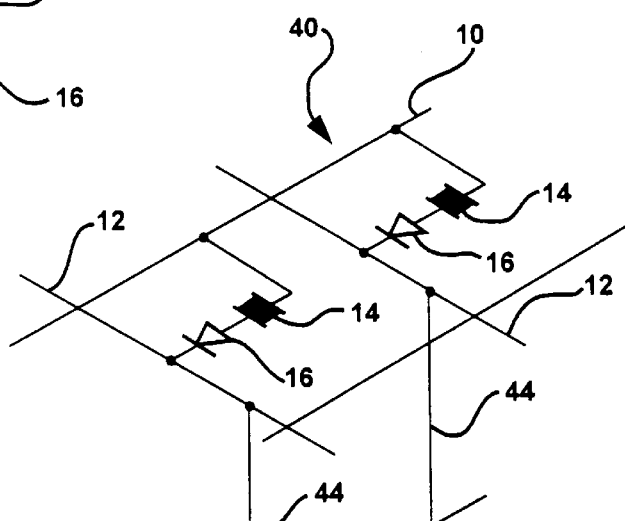
FIG. 9 is a schematic depiction of a portion of two stacked planes of unit cells of a neural network structure in accordance with the principals of the present invention.

A unit cell which may be employed in this embodiment and in other embodiments as well is shown in FIG. 8. Referring now to FIG. 8, there is shown a typical unit cell which may be employed in the present invention. The unit cell includes a data input line 10 and a data output line 12. Communication between the two lines 10,12 is established via a universal memory element 14 of the present invention. FIG. 9 depicts, in schematic form, a portion of a stacked array of two matrices 140, 142, each including unit cells interconnected by a vertical via 44. Similar stacked matrices are contemplated within the scope of the present invention for the other unit cells shown herein.

The unit cell further includes an isolation device, such as a diode 16. Typically, the unit cells are arranged in an array wherein the data input 10 and data output lines 12 comprise a series of rows and columns and in this embodiment an isolation device 16 functions to prevent cross talk between adjacent unit cells. The isolation device is depicted as being a diode 16, and as such may comprise a thin film diode such as a polycrystalline silicon diode although amorphous, polycrystalline or crystalline diodes of various other materials may be similarly employed as may be other devices such as transistors. When structures comprising chalcogenides and polycrystalline diodes are to be fabricated, the diodes are generally deposited as amorphous devices, utilizing thin film technology and they are subsequently crystallized. In accord with the present invention, it has been found advantageous to crystallize the diode material through the use of a short pulse of light from a laser or similar source so as to rapidly crystallize the material without damaging the chalcogenide material.

The cell of FIG. 8 is part of a matrix of generally identical cells arranged in rows and columns. The processor of the present invention includes a stacked array of such matrices and at least some of the cells in a first matrix are interconnected with cells in a second matrix so that the data output of the cell in the first plane 140 communicates with the input of the cell in a second plane 142.

FIG. 9 depicts, in schematic form, a portion of a stacked array of two matrices 140, 142, each including unit cells interconnected by a vertical via 44. Similar stacked matrices are contemplated within the scope of the present invention for the other unit cells shown herein.

The unit cell further includes an isolation device, such as a diode 16. Typically, the unit cells are arranged in an array wherein the data input 10 and data output lines 12 comprise a series of rows and columns and in this embodiment an isolation device 16 functions to prevent cross talk between adjacent unit cells. The isolation device is depicted as being a diode 16, and as such may comprise a thin film diode such as a polycrystalline silicon diode although amorphous, polycrystalline or crystalline diodes of various other materials may be similarly employed as may be other devices such as transistors. When structures comprising chalcogenides and polycrystalline diodes are to be fabricated, the diodes are generally deposited as amorphous devices, utilizing thin film technology and they are subsequently crystallized. In accord with the present invention, it has been found advantageous to crystallize the diode material through the use of a short pulse of light from a laser or similar source so as to rapidly crystallize the material without damaging the chalcogenide material.

The cell of FIG. 8 is part of a matrix of generally identical cells arranged in rows and columns. The processor of the present invention includes a stacked array of such matrices and at least some of the cells in a first matrix are interconnected with cells in a second matrix so that the data output of the cell in the first plane 140 communicates with the input of the cell in a second plane 142.

It is noted that the vertical vias 44 of FIG. 9 provide means for establishing communication between the data input line 10 of a first unit cell in the matrix 140 and the data output line 12 of a second unit cell in the matrix 142. As seen from FIG. 9 the communication occurs by through a volume of memory material of at least one of the unit cells. The connection between a data input line 10 in the matrix 140 and a data output line 12 in the matrix 142 is determined by the distinguishable programmed states of the chalcogenide based mutlivalue-digital phase change memory element.

The data processing network may further comprise means for programming each unit cells to one the programmed states. The means for programming may comprise a means for applying an electrical signal to the volume of memory material of each unit cell.

Figure 10:
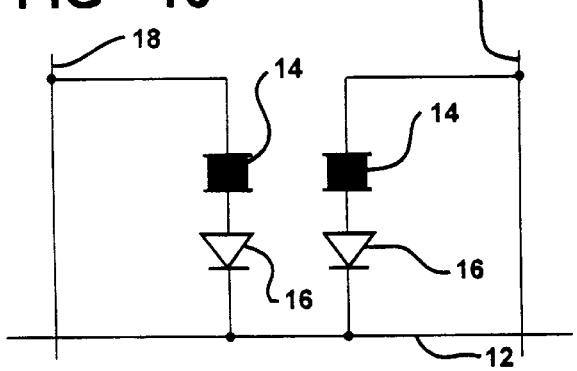
FIG. 10 is a schematic depiction of another embodiment of unit cell of a neural network structure in accordance with the principals of the present invention and including inhibitory and excitory lines.

FIG. 10 depicts a unit cell including an excitory 18 input and inhibitory 20 input and a data output line 12. This embodiment further includes a universal memory multivalue-digital storage element 14 and an isolation device 16 associated with each of the input lines 18, 20. A unit cell of this type can receive bipolar data which either stimulates or inhibits an output response. In the foregoing unit cells, the Ovonic memory multivalue-digital storage element is programmed by signals applied to the data input lines 10, 18, 20 and the data output lines 12.

Figure 11:
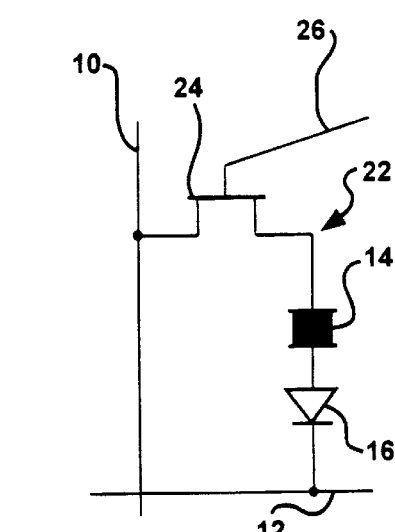
FIG. 11 is a schematic depiction of yet another unit cell of a neural network structure in accordance with the principals of the present invention and including a separate control line.

FIG. 11 depicts yet another embodiment of the present invention which further includes a field effect transistor 22 having the source and drain in series with a data input line 10 and an Ovonic memory multivalue-digital storage element 14. The gate 24 of the transistor is energized by a separate control line 26. In a unit cell of this type, data impressed on the control line 26 can further modify or supplement data on the input line 10 so as to further influence the setting and resetting of the Ovonic memory multivalue-digital storage element 14.

Figure 12:
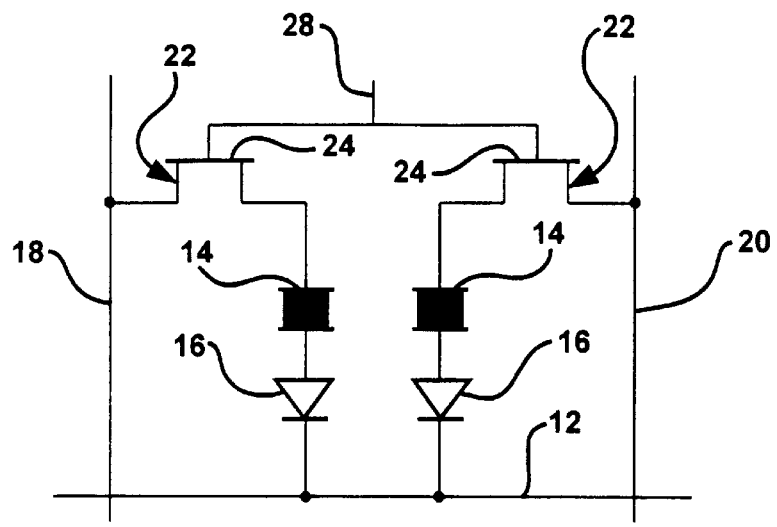
FIG. 12 is a schematic depiction of yet another unit cell of a neural network structure in accordance with the principals of the present invention including excitory and inhibitory lines controlled by a common input line.

Referring now to FIG. 12 there is shown still another embodiment of unit cell. This cell includes excitory 18 and inhibitory lines 20, each having a field effect transistor 22 having the source and drain thereof in series with a universal memory multivalue-digital storage element 14 and an isolation diode 16. The gates 24 of each of the transistors 22 are controlled by a common control line 28. In the operation of a unit cell of this type, the common control line 28 receives input data, such as data from a pixel of an image sensor and communicates this data to the unit cell. Excitory and inhibitory data on the respective lines 18, 20 modifies the cell's response to this data so as to generate an output which is communicated to other cells in the processing net.

It is noted that the parallel processing network of the present invention includes means for a parallel input of a plurality of data. Also, the means for a parallel input of a plurality of data may further include means for sensing a preselected chemical species and generating an electrical signal in response thereto.

Further, the means for a parallel input of a plurality of data may include means for a parallel input of electrical data. As well, the means for a parallel input of a plurality of data may include means for a parallel input of optical data. The means for a parallel input of optical data may include means for converting optical data to electrical data. The means for converting optical data to electrical data may include a photoresponsive body of silicon alloy material.

It is to be understood that the foregoing is illustrative of particular neural network unit cell configurations which may be employed in the present invention. Other variations of unit cell may be similarly employed. The present invention encompasses all parallel distributing processing arrays having interconnected unit cells which include a universal memory multivalue-digital storage element of the present invention. The present invention readily lends itself to the fabrication of neural network computing systems as well as various other parallel processing devices.

Within the context of the present invention, the volume of memory material is preferably a chalcogenide based material. Chalcogenide based materials include one or more chalcogenide elements therein and it is generally understood that the chalcogenide elements include the group IVa elements of the periodic table. The volume of memory material may include one or more elements from the group consisting of carbon, silicon, germanium, tin, lead, phosphorus, arsenic, antimony, flourine, and bismuth.

Figure 13:
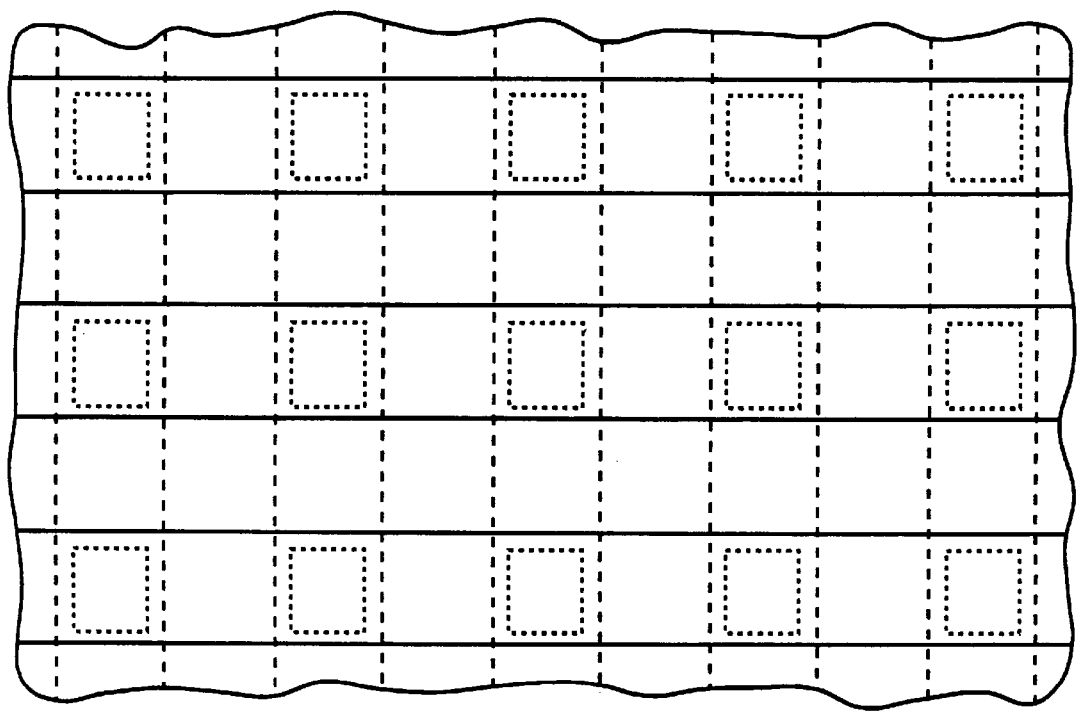
FIG. 13 is the top view of a possible layout of multiple memory elements useful for data storage in accordance with the principals of the present invention and specifically showing how the elements would be connected to a set of X-Y addressing lines.

Another use of the memory elements of the present invention comprises data storage arrays. The top view of a possible configuration for multiple memory element data storage is shown in FIG. 13. As shown, the devices form an X-Y matrix of memory elements. The horizontal strips 12 represent the X set of an X-Y electrode grid for addressing the individual elements. The vertical strips 42 represent the Y set of addressing lines.

Figure 14:
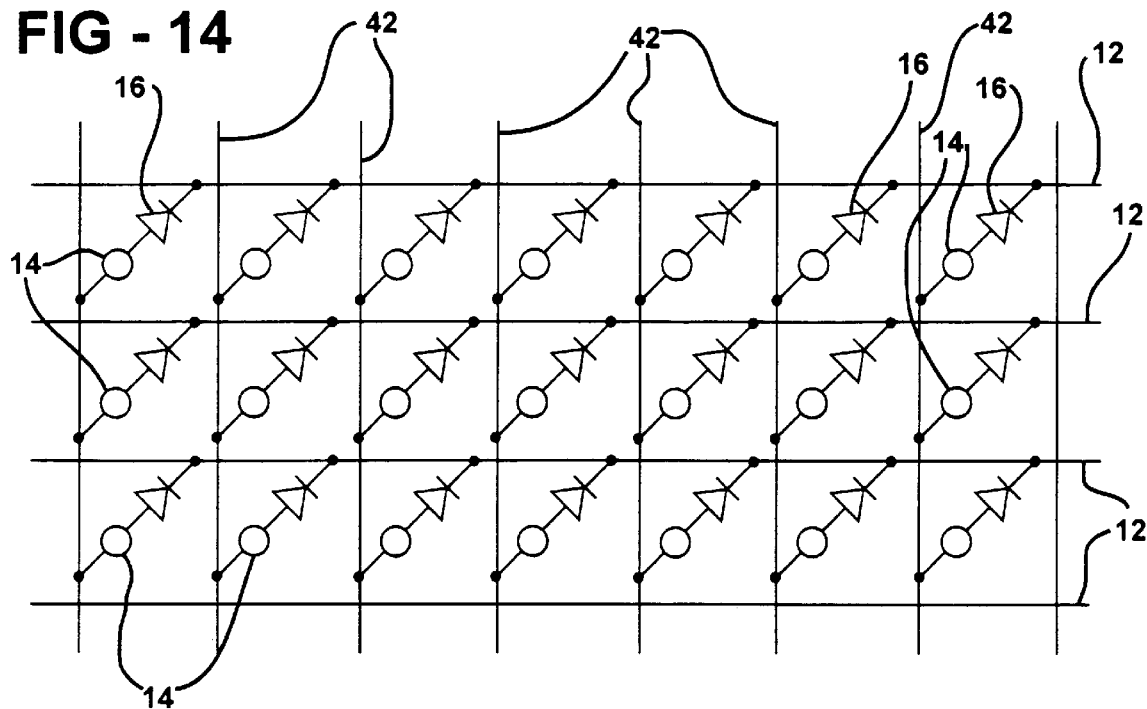
FIG. 14 is a schematic diagram of a matrix of memory elements useful for data storage in accordance with the principals of the present invention and specifically showing how isolation elements such as diodes are connected in series with the memory elements to electrically isolate each of the memory elements from the others.

Each memory element is electrically isolated from the others by using some type of isolation element. FIG. 14, a schematic diagram of the memory device layout, shows how electrical isolation can be accomplished using diodes. The circuit comprises an X-Y grid with the memory elements 14 being electrically interconnected in series with isolation diodes 16. Address lines 12 and 42 are connected to external addressing circuitry in a manner well known to those skilled in the art. The purpose of the isolation elements is to enable each discrete memory elements to be read and written without interfering with information stored in adjacent or remote memory elements of the matrix.

Figure 15:
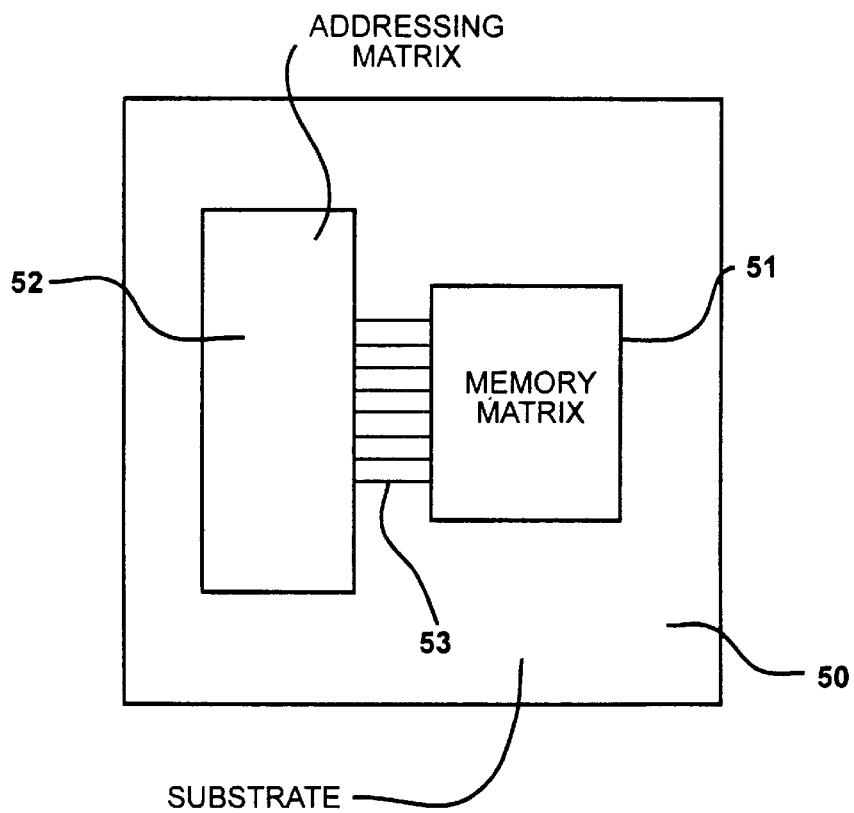
FIG. 15 is a schematic representation illustrating a single crystal semiconductor substrate with an integrated memory matrix according to the principles of the instant invention placed in electrical communication with an integrated circuit chip on which the address drivers/decoders are operatively affixed.

FIG. 15 shows a portion of a single crystal semiconductor substrate 50 with a memory matrix 51 of the present invention formed thereon. Also formed on the same substrate 50 is an addressing matrix 52 which is suitably connected by integrated circuitry connections 53 to the memory matrix 51. The addressing matrix 52 includes signal generating means which define and control the setting and reading pulses applied to the memory matrix 51. Of course, the addressing matrix 52 may be integrated with and formed simultaneously with the solid state memory matrix 51.

Figure 16:
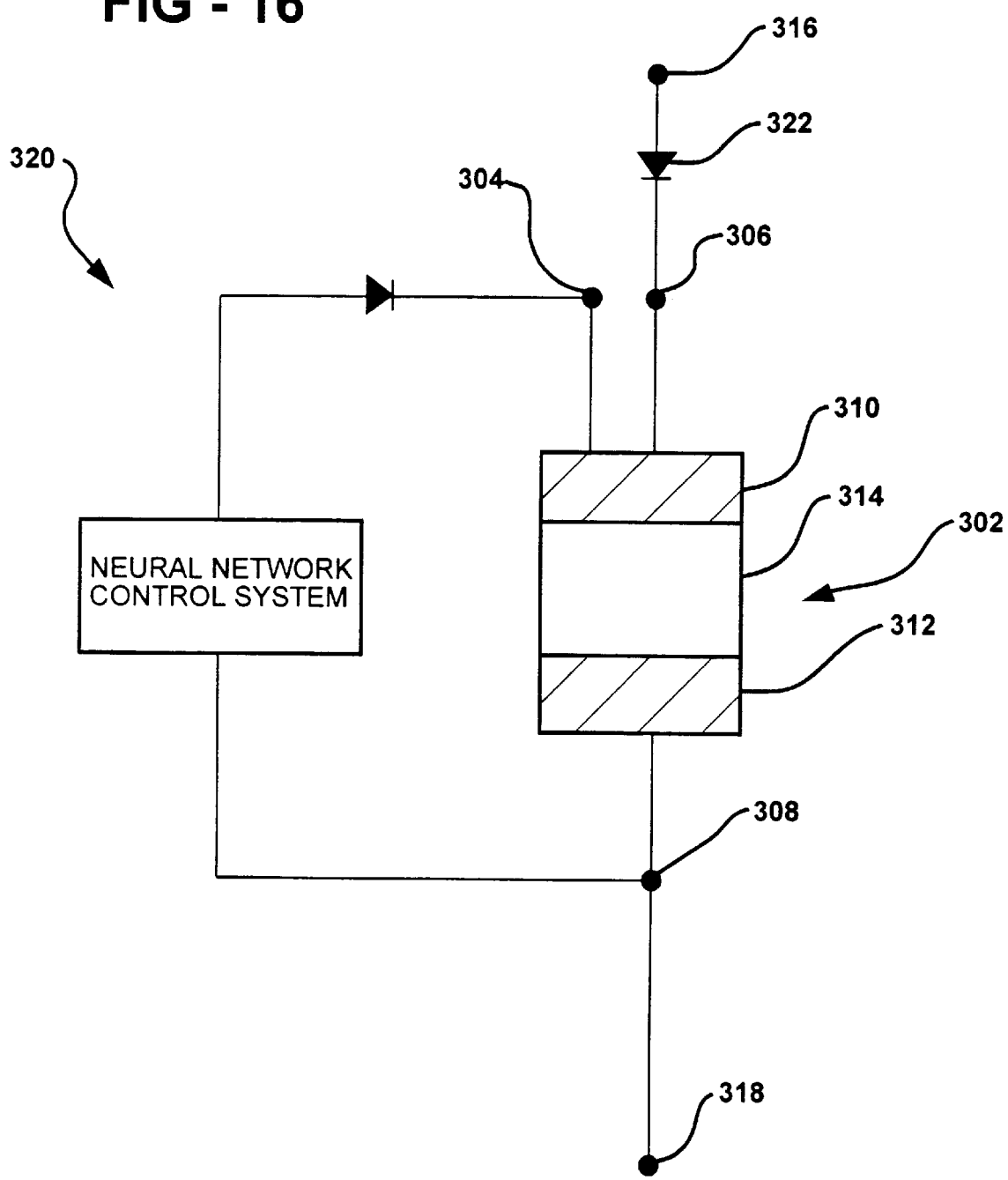
FIG. 16 is a schematic diagram of an embodiment of the present invention as applied to controlling connectivity between nodes of a nodal network in a neural network system.

In another embodiment as shown in FIG. 16, a universal memory element of the invention is incorporated as a connectivity element in a nodal network of a neural network system. As shown in FIG. 16, a universal memory element 302 of the invention is configured as a three terminal device having a control terminal 304, a signal terminal 306 and a common control and signal terminal 308. Terminals 304 and 306 are connected to one electrode 310 of the device 302 and terminal 308 is connected to the other terminal 312 of the device. Electrodes 310 and 312 are connected across phase change element 314 to control the switching thereof in a manner already described.

Terminals 306 and 308 are connected respectively to nodes 316 and 318 of a nodal network of a neural network system. The memory element 302 is thus connected to control the connectivity between the nodes 316 and 318. That is, when the element 302 is in its high resistance state, the connectivity between nodes 316 and 318 is minimized and when the element 302 is in its low resistance state, the connectivity between nodes 316 and 318 is maximized.

Control of element 302 is realized in the embodiment shown by a neural network control system 320 which is connected to electrode 310 through control terminal 394 and to electrode 312 through common terminal 308. Weighted pulses are applied by the neural network control system 320 to the universal memory element 302 through terminals 304 and 308 using a control strategy that decides when the pulses are applied and what weights are assigned to them. The effect of these pulses is cumulatively stored in the memory element 302. When the selected threshold level is reached in memory element 302, it switches or "fires" to its low resistance state to increase the level of connectivity between the nodes 316 and 318. If desired, a blocking diode may be inserted between node 316 and terminal 306 to isolate the nodal network from the control pulses that are applied to the control terminal 304.

The terminals 304, 306 and 308 may be positioned adjacent the element 302 or located more remotely from the element to accommodate ease of connection with other devices and circuits. For example, in an integrated circuit application of the embodiment of FIG. 16, the terminals 304, 306 and 308 may be located in a manner best suited to the element forming and metallization steps of the integrated circuit in making and providing for internal and external connections to other devices and circuits.

The embodiment of FIG. 16 shows only a pair of nodes in a nodal network that contains many nodes and it is to be understood that all or any selected portion of the nodes in the network can be interconnected by the connectivity elements of the invention in the manner shown in FIG. 16.

As discussed earlier the method of programming of the present invention is applicable to field of cryptography. One of the basic methods of cryptography is the use of an encryption key. The key is used to encrypt and decrypt the transmitted information. The problem with using a key is that if the key is known to a third party, the encrypted information can be decoded by the third party. Today, the best encryption keys are hundreds or thousands of digits long. It is impossible for anyone to memorize such a lengthy number. Therefore the encryption key for data transmitted via the Internet, for example, may be stored on the hard drives of the computers involved in the data transmission. Storage on the hard drive makes the number accessible to anyone gaining access to the computers simply by reading the information directly from the hard drive. Thus the encryption key is easily obtained.

The use of the universal memory devices of the invention, programmed by the techniques disclosed herein, to store encryption keys will eliminate the problem of unauthorized reading of the encryption key. That is, because of the destructive read required to determine the state of each memory element, unless the person trying to read the key programmed into universal memory chip array of the invention knows the programming pulse width, amplitude, etc used to program the memory elements, he will not be able to reliably read the data stored in the memory element.

For instance, suppose in programming the Ovonic memory element, 8 pulses of 40 nanoseconds were used as the total number of pulses required to switch the device from the high resistance state to the low resistance state. Further suppose that the memory was programmed with 5 pulses, thus requiring 3 more pulses to set the device for a total time still needed of 120 nanoseconds. Now suppose that someone who does not know how the device has been programmed tries to read the programming state of the device. They will not know that the device was programmed using 40 nanosecond pulses. Therefore, when they try to read the device they will not be likely pick the proper programming pulse length. Suppose for example they choose 60 nanosecond programming pulses to try and read the device. They will pulse the device only twice before it switches from the high resistance state to the low resistance state. Therefore even if they knew the total number of programming states, they would get an incorrect result of 6 instead of the programmed 5. Additionally, if the total number of programming states is not known, it will be impossible to know the number from which to subtract the number of pulses required to set the device to the low resistance state.

Therefore it is clear that without knowing the programming parameters for the memory elements, it is impossible to read the programming state of the device.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An encryption method of storing and retrieving information in a phase-change memory element having a phase-change memory material with at least a high resistance state and a detectably different low resistance state, said phase change material being capable of being set from said high resistance state to said low resistance state by a set energy pulse, said method comprising the steps of:

storing information in said memory element by applying at least one program energy pulse to said phase change memory material, said at least one program energy pulse being insufficient to set said memory material from said high resistance state to a detectably different low resistance state but sufficient to modify said memory material so that the accumulation of said at least one program energy pulse with at least one additional program energy pulse sets said memory material from said high resistance state to a detectably different low resistance state; and retrieving information stored in said memory element by applying to said memory element additional program energy pulses until said memory element is caused to switch to its detectably different lower resistance state and counting the number of program energy pulses applied to cause said memory element to switch to its lower resistance state.

2. The method of claim 1, wherein said energy is electrical energy.

3. The method of claim 1, wherein said phase-change material includes one or more elements selected from the group consisting of Te, Se, Ge, Sb, Bi, Pb, Sn, As, S, Si, P, 0 and mixtures or alloys thereof.

4. The method of claim 3, wherein said phase-change material includes at least one chalcogen element and at least one transition metal element.

5. The method of programming of claim 4, wherein said chalcogen element is selected from the group of Te, Se and mixtures or alloys thereof.

6. The method of programming of claim 5, wherein said chalcogen element is a mixture of both Te and Se.

7. The method of programming of claim 6, wherein said at least one transition metal element is selected from the group consisting of Cr, Fe, Ni, Nb, Pd, Pt and mixtures or alloys thereof.

8. A method of controlling an interconnection element to change connectivity in a neural network, said interconnection element comprising a unit cell including a phase change material having at least a high resistance state and a low resistance state, said phase change material being capable of being set from said high resistance state to said low resistance state by a set energy pulse and from said low resistance state to said high resistance state by a reset energy pulse, said method comprising the steps of:

applying a reset energy pulse to said unit cell to reset said phase change material to its high resistance state; and applying to said unit cell program energy pulses of selected weights and durations based on the control strategy of said neural network, at least some of said program energy pulses being individually insufficient to set said memory material from said high resistance state to said low resistance state but sufficient to modify said phase change material so that the accumulation of said at least some program energy pulses with at least one or more additional program energy pulse sets said phase change material from said high resistance state forming a first level of connectivity to its low resistance state forming a second level of connectivity different from that of said high resistance state.

9. The method of claim 8, wherein said energy is electrical energy.

10. The method of claim 8, wherein said phase-change material includes one or more elements selected from the group consisting of Te, Se, Ge, Sb, Bi, Pb, Sn, As, S, Si, P, 0 and mixtures or alloys thereof.

11. The method of claim 10, wherein said phase-change material includes at least one chalcogen element and at least one transition metal element.

12. The method of programming of claim 11, wherein said chalcogen element is selected from the group of Te, Se and mixtures or alloys thereof.

13. The method of programming of claim 12, wherein said chalcogen element is a mixture of both Te And Se.

14. The method of programming of claim 13, wherein said at least one transition metal element is selected from the group consisting of Cr, Fe, Ni, Nb, Pd, Pt and mixtures or alloys thereof.

15. A control apparatus for controlling the level of connectivity between nodes in a nodal network of a neural network system comprising:

a unit cell including a phase change material having at least a high resistance state and a low resistance state, said phase change material being capable of being set from said high resistance state to said low resistance state by a set energy pulse and from said low resistance state to said high resistance state by a reset energy pulse, first and second electrodes electrically connected to said phase change material for (a) applying electrical energy to said phase change material for switching said phase change material between its high resistance and low resistance states and (2) for establishing a signal conduction path through said phase change material when said phase change material is in its low resistance state;

a control terminal and a signal terminal, both being electrically connected to said first electrode;

a common control and signal terminal being connected to said second electrode;

said signal terminal being electrically connected to a first node of said nodal network and said common control and signal terminal being electrically connected to a second node of said nodal network to control the level of connectivity between said first and second nodes; and a neural network control system electrically connected to said control terminal and to said common control and signal terminal for applying weighted control pulses to said phase change material to cause said phase change material to switch from its high resistance state to its low resistance state and thereby increase the level of connectivity between said first and second nodes when the cumulative effect of said control pulses exceeds the switching threshold level of said phase change material.

16. The control apparatus of claim 15, wherein said energy is electrical energy.

17. The control apparatus of claim 15, wherein said phase-change material includes one or more elements selected from the group consisting of Te, Se, Ge, Sb, Bi, Pb, Sn, As, S, Si, P, O and mixtures or alloys thereof.

18. The control apparatus of claim 17, wherein said phase-change material includes at least one chalcogen element and at least one transition metal element.

19. The control apparatus of claim 18, wherein said chalcogen element is selected from the group of Te, Se and mixtures or alloys thereof.

20. The control apparatus of claim 19, wherein said chalcogen element is a mixture of both Te and Se.

21. The control apparatus of claim 20, wherein said at least one transition metal element is selected from the group consisting of Cr, Fe, Ni, Nb, Pd, Pt and mixtures or alloys thereof.

* * * * *